(12) United States Patent
Wang

(10) Patent No.: US 8,302,420 B2
(45) Date of Patent: Nov. 6, 2012

(54) METHOD FOR VENTING GAS INTO CLOSED SPACE AND GAS SUPPLY ASSEMBLY THEREOF

(75) Inventor: You-Jin Wang, Milpitas, CA (US)

(73) Assignee: Hermes Microvision, Inc., Hsinchu (TW)

( * ) Notice: Subject to any disclaimer, the term of this patent is extended or adjusted under 35 U.S.C. 154(b) by 863 days.

(21) Appl. No.: 12/430,453

(22) Filed: Apr. 27, 2009

(65) Prior Publication Data

US 2010/0270467 A1    Oct. 28, 2010

(51) Int. Cl.
*B01F 3/04*    (2006.01)
(52) U.S. Cl. .......................................... 62/306

(58) Field of Classification Search ................. 62/306, 62/309; 137/14, 154; 250/310
See application file for complete search history.

(56) References Cited

U.S. PATENT DOCUMENTS 3,296,777 A * 1/1967 Jackson et al. ................. 96/227
2005/0272891 A1* 12/2005 Fouarge et al. ............... 526/943
* cited by examiner

*Primary Examiner* — Melvin Jones
(74) *Attorney, Agent, or Firm* — Rosenberg, Klein & Lee

(57) ABSTRACT

A method for venting a gas into a closed space is disclosed. At the beginning of the venting process the flow rate of the venting gas starts from zero and then increases at a substantially differential incremental rate for at least a certain period of time. When a predefined saturation pressure inside the closed space is reached, the flow rate of the venting gas is maintained or increased to speed up the venting process.

20 Claims, 12 Drawing Sheets

METHOD FOR VENTING GAS INTO CLOSED SPACE AND GAS SUPPLY ASSEMBLY THEREOF

BACKGROUND OF THE INVENTION

1. Field of the Invention

The present invention relates to a method for controlling particle contamination on a sample surface, and more particularly, to a method for venting a gas into a closed space without generating particles or lifting particles off surfaces therein during sample transfer from a vacuum to atmospheric environment.

2. Background of the Related Art

Charged particle beam imaging, such as electron beam imaging inspection (EBI) of a sample is typically performed in a vacuum environment. For example, the environmental pressure of the sample during imaging is equal to or lower than $1.0 \times 10^{-5}$ Torr. For convenience of description, this definition of vacuum pressure will hold hereinafter in the specification. When the imaging step is complete, the sample needs to be transferred back to the atmospheric environment. Transition from a vacuum to atmospheric environment is typically carried out by a two step process where the sample is first disposed in a vacuumed closed space, and then an inert gas such as nitrogen is slowly vented into the closed space till the pressure inside the closed space reaches a desired level (e.g. close to the atmospheric pressure). Next, the closed space is opened, allowing the sample to be moved out and into the atmospheric environment.

As illustrated in FIG. 1, a charged particle beam imaging system 10 may include a load port 12, a sample feed chamber 14, an image forming apparatus 16 (in FIG. 2), an imaging chamber 18 and a conditioning chamber 20. The feed chamber 14 is used for pre-imaging and post-imaging storage of the sample. The load port 12 is connected with the feed chamber 14. The interested sample is fed into the feed chamber 14 through the load port 12. When imaging process is complete, the imaged sample is transferred out from the feed chamber 14 back to an external storage through the load port 12. The interior of feed chamber 14 and the load port 12 is at atmospheric pressure.

Referring to FIG. 2, the image forming apparatus 16 is mounted to the imaging chamber 18 wherein the sample is secured during imaging. The image forming apparatus 16 images the sample and form a grey level image of the sample. The interior of the imaging chamber 18 is typically at a vacuum pressure. The conditioning chamber 20, which includes a load lock structure 22 connects to the imaging chamber 18. The conditioning chamber 20 is used for preparing the sample a proper environment for the subsequent operation. For example, when the sample is to be imaged, it is first placed in the conditioning chamber 20. Then, the conditioning chamber 20 is evacuated. When the internal pressure of the conditioning chamber 20 reaches a vacuum pressure, the sample is transferred to the imaging chamber 18 for imaging. When imaging is completed, the imaged sample is then transferred back into the conditioning chamber 20, and then the internal pressure of the conditioning chamber 20 is raised. When the internal pressure of the conditioning chamber 20 substantially reaches the atmospheric pressure, the sample is transferred out and forward to the next stage of process.

Referring to FIG. 2, the load lock structure 22 includes a movable bottom 221 and a movable upper portion 222. The bottom 221 and the upper portion 222 can be moved to tight contact against each other thereby forming a closed space 223. A plurality of elastic spacers 224 are arranged on the edges of the bottom 221 and the upper portion 222 to ensure sealed contacting edges and air-tightness of the formed closed space 223. Furthermore, as shown in FIG. 2, a stage 24 is set in the imaging chamber 18, and a vacuum arm 26 is set between the stage 24 and the load lock structure 22. The vacuum arm 26 is for transferring the sample between the stage 24 and the load luck structure 22. The stage 24 is for supporting the sample thereon during charged particle beam imaging.

In practice, when a sample 28 is to be transferred from the feed chamber 14 to the imaging chamber 18 for imaging, the sample 28 is first placed on the bottom 221, and the upper portion 222 is moved to cover the bottom 221. As a result, the sample 28 is enclosed in the formed closed space 223. A pumping process is then performed to evacuate the formed closed space 223. When a desired vacuum level has been reached, the bottom 221 is lowered to open the closed space 223 and the sample 28 is transferred out to the stage 24 by the vacuum arm 26, so that an atmosphere-to-vacuum transition process is completed.

When the imaging step is complete, the sample 28 needs to be transferred back to the atmospheric environment. The transition from a vacuum to atmospheric environment, a vacuum-to-atmosphere transition process, is typically carried out by following steps. The sample 28 is first transferred from the stage 24 by the vacuum arm 26 and placed on the bottom 221 which is then lifted to contact with the upper portion 222. As a result, the sample 28 is again enclosed in the formed vacuumed closed space 223. Then, an inert gas such as nitrogen is slowly vented into the closed space 223 till the pressure inside the closed space 223 reaches a desired level (e.g. close to the atmospheric pressure). When the gas venting process is complete, the upper portion 222 is lifted to uncover and thus open the closed space 223 to allow the sample 28 to be moved out and into the atmospheric environment (i.e. to the feed chamber 14). The vacuum-to-atmosphere transition process is thus completed. When the next sample 28 is to be transferred to the imaging chamber 18 for imaging, the atmosphere-to-vacuum transition process is performed again inside the conditioning chamber 20.

During the vacuum-to-atmosphere transition process, the major problem is a frequent under-controlled particle contamination on the sample 28 surface. The inert gas is more too often easily supplied at an overly fast flow rate. The strong gas stream deforms and/or shifts the sample 28, producing tiny particles. In addition, the gas stream may also lift particles present in the closed space 223, for example stowaways carried in by the sample 28 from outside of the closed space 223.

On the other hand, the friction and deformation that occurs to the surface of the elastic spacers 224 is also suspicious for producing undesirable particles. For example, the surface of the elastic spacers 224 may wear away due to friction against the edges of the upper portion 222 or the bottom 221. Also, deformation of the bottom 221, upper portion 222, and elastic spacers 224 may produce tiny fragments. As a result, lots of fragments/particles are released from the surface of each of these elements, which then become a potential contaminant to the sample 28 surface.

Currently, to overcome this problem, the gas flow rate is controlled by using a valve with an adjustable opening diameter. FIG. 3 is a diagram illustrating operation of a gas venting process in accordance with the prior art. The valve opening is first kept small, as illustrated in stage (I) of FIG. 3, allowing a weak stream of gas flowing into the closed space. This allowed stream is so weak that it barely lifts any particles. After a certain period of time, the pressure inside the closed space comes to a saturation pressure, at which the incoming gas no longer causes disturbance and thus convection to the gas inside the closed space. The gas flow rate is then raised to a higher value, as illustrated in stage (II) of FIG. 3, to speed up the overall gas venting process. The gas venting process ends when the pressure inside the closed space comes to a desired final pressure. The desired final pressure is typically selected to be close or equal to the atmospheric pressure. It is noted that the saturation pressure is generally smaller than the desired final pressure, and can be determined by experiments with a pressure gauge.

The foregoing two-stage approach has a drawback of irreproducible results. As the opening of the valve is controlled by a mechanical parts assembly, even with identical valve setting parameters, the opening diameter can change due to, for example, attrition at the surface of involving parts of the valve. Such change in the opening size, even subtle, leads to a change in the gas flow rate which is large enough to spoil the convection characteristics inside the closed space previously observed acceptable, resulting in severe change in the amount of particles that end up being lifted. In other words, the previously selected valve settings no longer apply in the next operation from the view point of particle contamination control. As a result, the valve settings have to be determined again, for example, through experiments.

Accordingly, the conventional gas venting method has a trade-off of either being time-costly or ineffective. As the size of the semiconductor pattern shrinks significantly with the advancing fabrication technology, particle contamination on the surface of a pattern or processed feature has become more and more unacceptable. Therefore, it is desirable to provide a repeatable gas venting method.

SUMMARY OF THE INVENTION

One feature of the present invention is to provide a method for venting a gas into a closed space which is more reliable in achieving reproducible results so as to effectively and efficiently control particle contamination on the sample surface.

Accordingly, in one embodiment of the present invention a method for venting a gas into a closed space is disclosed, which comprises venting a gas with a first gas flow rate into the closed space until the pressure inside the closed space reaches a first pressure level, and then venting the gas with a second gas flow rate into the closed space until the pressure inside the closed space reaches a second pressure level, wherein the first gas flow rate increases at a substantially differential incremental rate for a certain period of time before the first pressure level is reached.

Another embodiment of the present invention provides a charged particle beam imaging system having a gas supply assembly for venting a gas into the conditioning chamber. The interior of the conditioning chamber is initially at vacuum pressure. The gas supply assembly operates such that the gas is first vented into the conditioning chamber at a first gas flow rate until the pressure inside the conditioning chamber changes from vacuum to a first pressure level. Then, the gas is vented into the conditioning chamber at a second flow rate until the pressure inside the conditioning chamber reaches a second pressure level. The first gas flow rate increases at a substantially differential incremental rate for a certain period of time before the first pressure level is reached.

DETAILED DESCRIPTION OF THE INVENTION

A method for venting a gas into a closed space includes the following steps. First, the gas with a first gas flow rate is vented into the closed space until the pressure inside the closed space reaches a first pressure level. The first gas flow rate increase at a substantially differential incremental rate for a certain period of time before the first pressure level is reached. Then, the flow rate of the venting gas is changed to a second gas flow rate which is equal to or higher than the first gas flow rate, and the gas with the second gas flow rate continues to be vented into the closed space until the pressure inside the closed space reaches a second pressure level. The first pressure level may be a saturation pressure level at which the incoming gas no longer causes disturbance and thus convection to the gas inside the closed space. In one embodiment, the saturation pressure level is set to be equal to or higher than one-thousandth of the atmospheric pressure (i.e. 0.76 Torr). The second pressure level may be a designated desired pressure. In one embodiment, this desired pressure is selected to be equal to or higher than the atmospheric pressure (~760 Torr).

It is noted that the incremental rate can be defined as being differential by being selected to be equal to or lower than a certain threshold value. In one embodiment, this threshold value is selected to be 0.1 Torr/second. In practice, it is possible that the incremental rate goes below the threshold value in the beginning and exceeds it at a later time.

Figure 1:
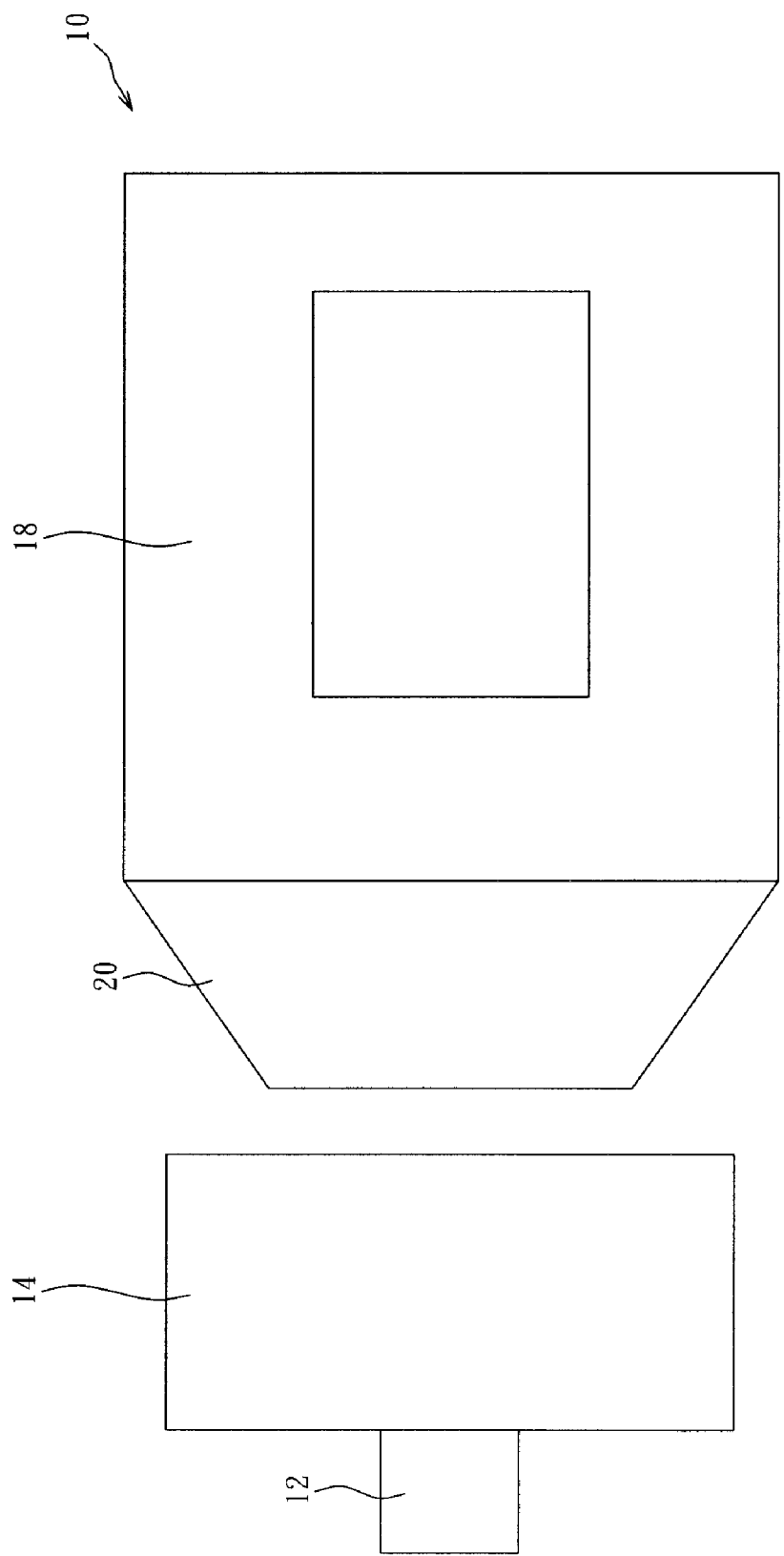
FIG. 1 is a diagram illustrating a conventional charged particle beam imaging system.
Figure 2:
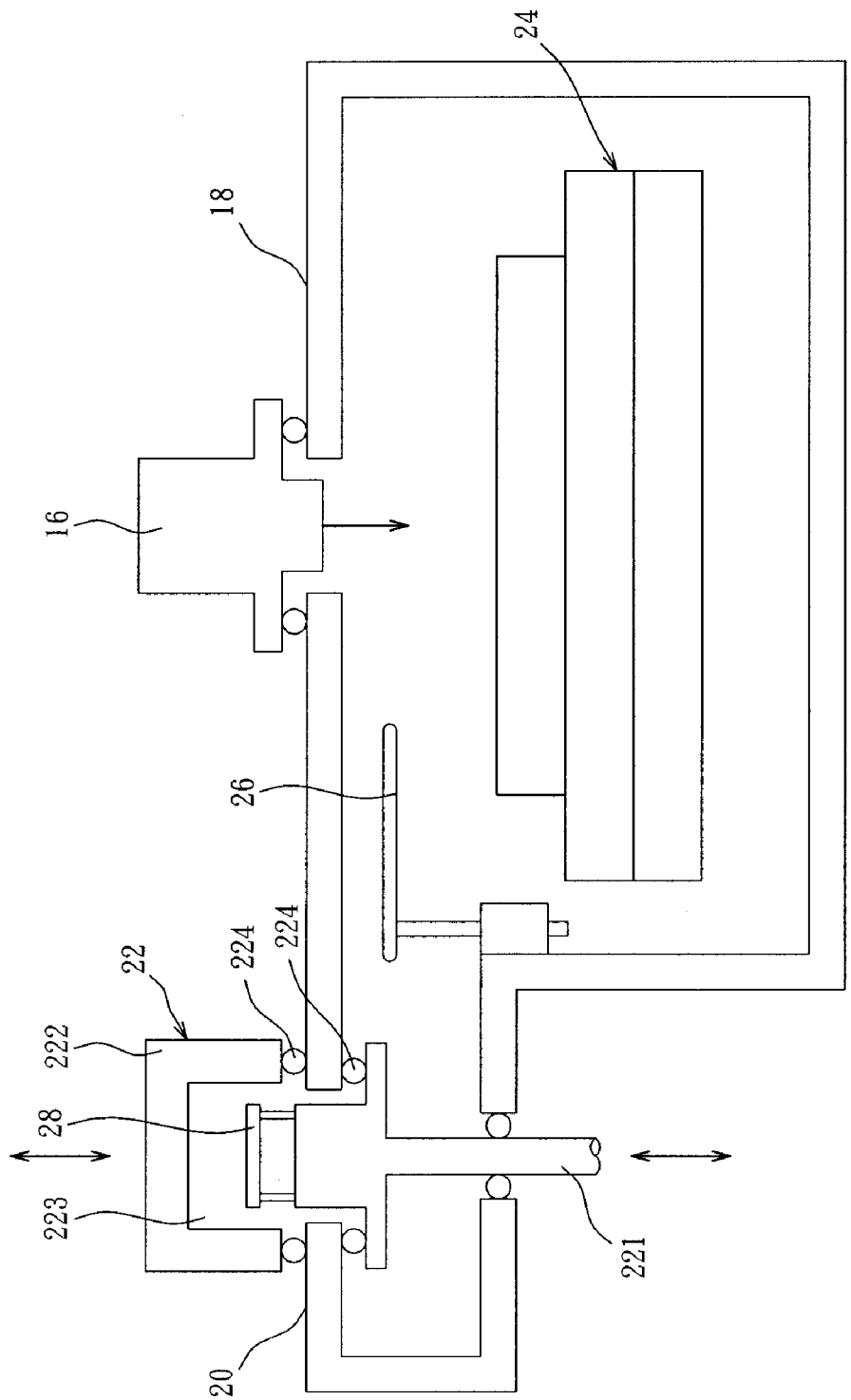
FIG. 2 is a diagram illustrating the structure of a conventional imaging and conditioning chamber.
Figure 3:
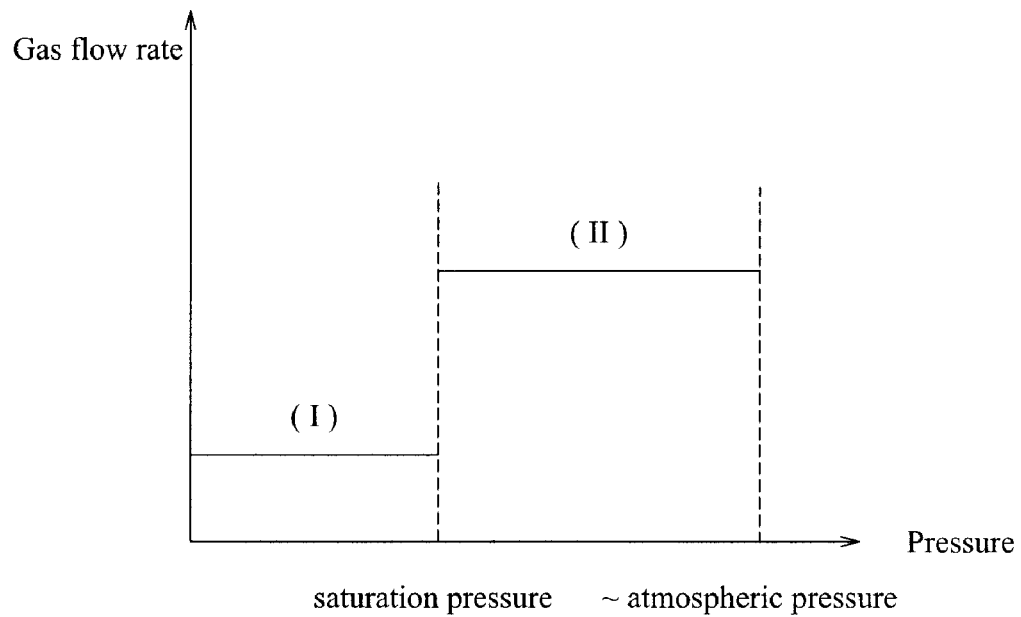
FIG. 3 is a diagram illustrating an operation of a gas venting process in accordance with the prior art.
Figure 4:
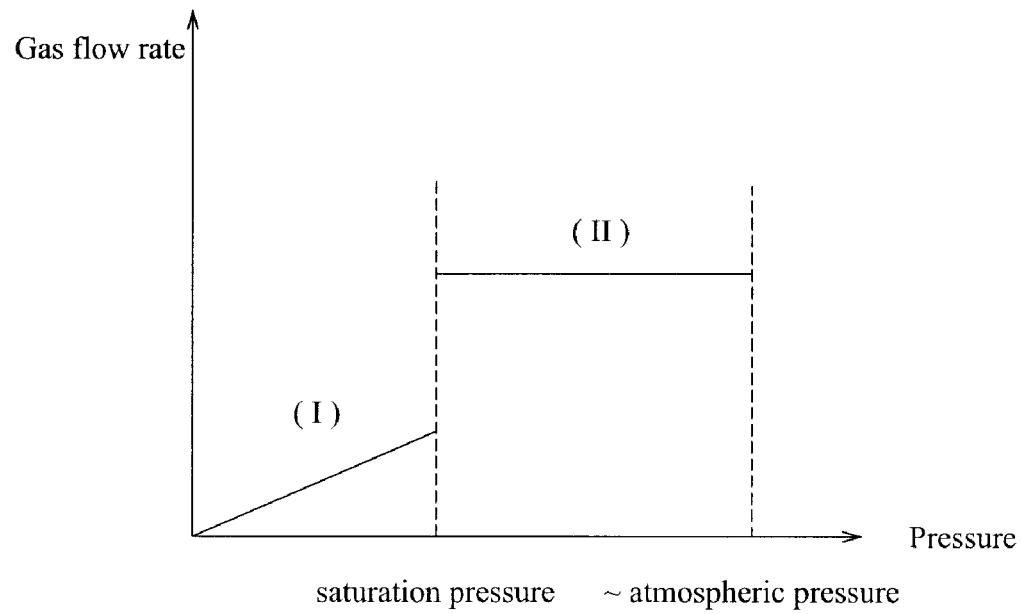
FIG. 4 to FIG. 10 are diagrams respectively illustrating operations of a gas venting process based on the gas flow rate in accordance with embodiments of the present invention.

FIG. 4 is a diagram illustrating an operation of a gas venting process based on the gas flow rate in accordance with an embodiment of the present invention. The horizontal axis represents the pressure inside the closed space; the vertical axis represents the flow rate of the venting gas into the closed space. In stage (I) of FIG. 4, the first gas flow rate of the venting gas starts preferably from zero and has a differential incremental rate. In this embodiment, the incremental rate is a constant, therefore the locus of the first gas flow rate is a straight line, as shown in stage (I) of FIG. 4. When the pressure inside the closed space reaches the saturation pressure, the flow rate of the venting gas is changed to the second gas flow rate as shown in stage (II) of FIG. 4. It is noted that the gas is vented at the first gas flow rate (which changes with the specified incremental rate) at least for a certain period of time before the first pressure level is reached; in this embodiment the first gas flow rate is continuously used until the saturation pressure is reached. As shown in FIG. 4, in this embodiment, the second gas flow rate is set to be higher than the first gas flow rate and then is maintained constant. The overall gas venting process can be speeded up by use of the fast second gas flow rate. The venting process ends when the pressure inside the closed space reaches a desired pressure. For example, the desired pressure can be equal to or higher than the atmospheric pressure (~760 Torr).

Figure 5:
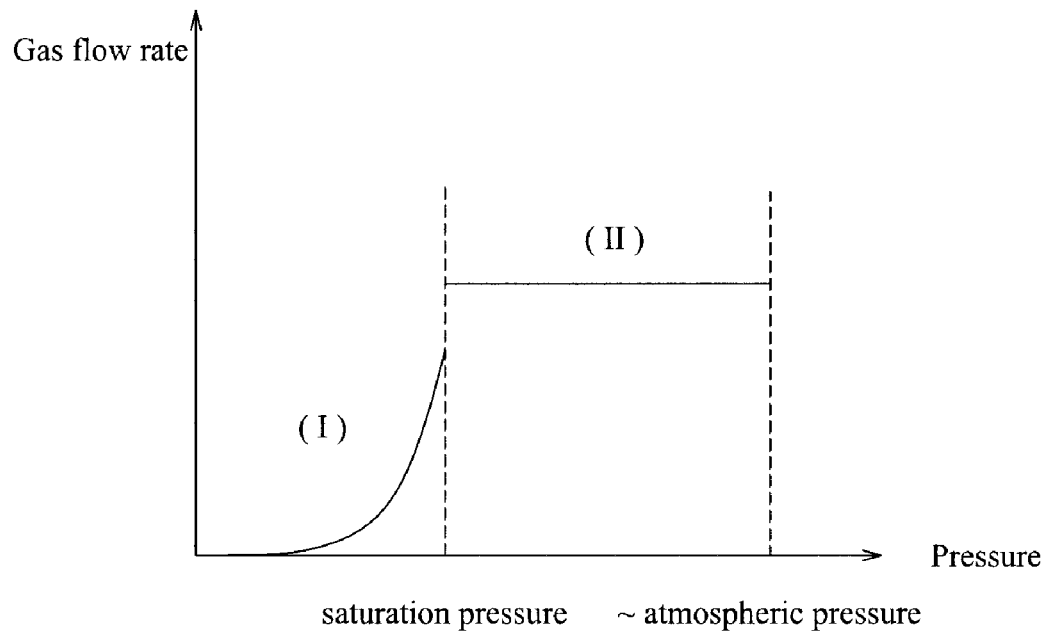
Figure 6:
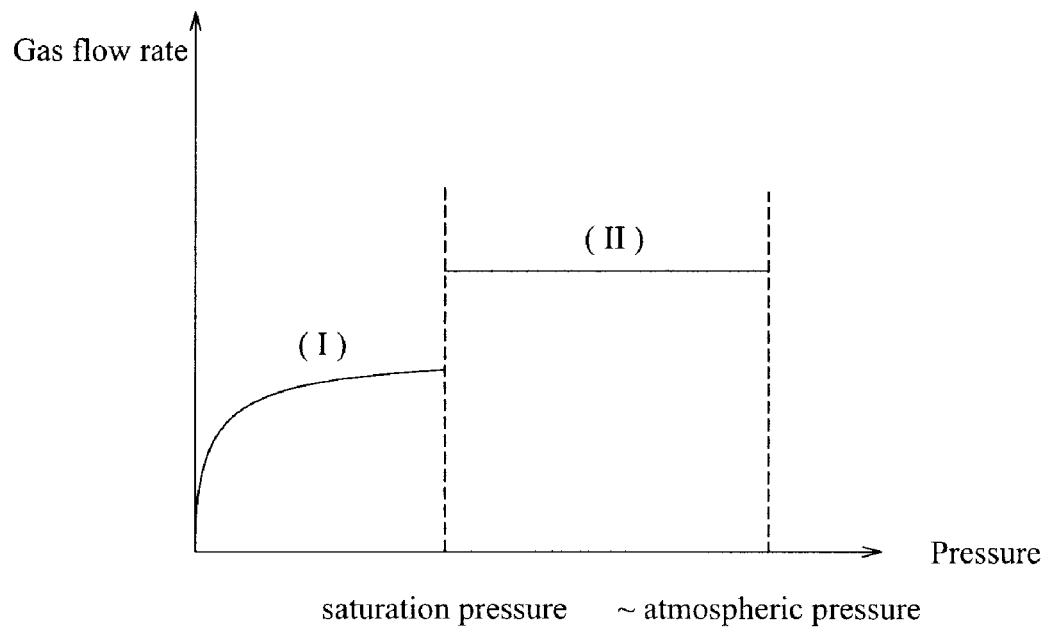

FIG. 5 and FIG. 6 illustrate alternative embodiments of FIG. 4. In the embodiment of FIG. 5, the first gas flow rate of the venting gas starts preferably from zero and increases at a differential incremental rate which increases with time at a certain rate, as illustrated in stage (I) of FIG. 5. The locus of the first gas flow rate is thus a parabolic curve with an opening facing upwards, as shown in stage (I) of FIG. 5. The second gas flow rate may be selected to be constant, as illustrated in stage (II) of FIG. 5. On the other hand, in the embodiment of FIG. 6, the first gas flow rate of the venting gas starts preferably from zero and increases at a differential incremental rate which decreases with time at a certain rate, as illustrated in stage (I) of FIG. 6. The locus of the first gas flow rate is thus a parabolic curve with an opening facing downwards, as shown in stage (I) of FIG. 5. The second gas flow rate may be selected to be constant, as illustrated in stage (II) of FIG. 6. It is noted that in both embodiments shown in FIG. 5 and FIG. 6, the gas is designed to be vented at the first gas flow rate (which changes with the specified incremental rate) at least for a certain period of time before the first (saturation) pressure level is reached. In the cases of FIG. 5 and FIG. 6, the first gas flow rate is continuously used until the saturation pressure is reached.

Figure 7:
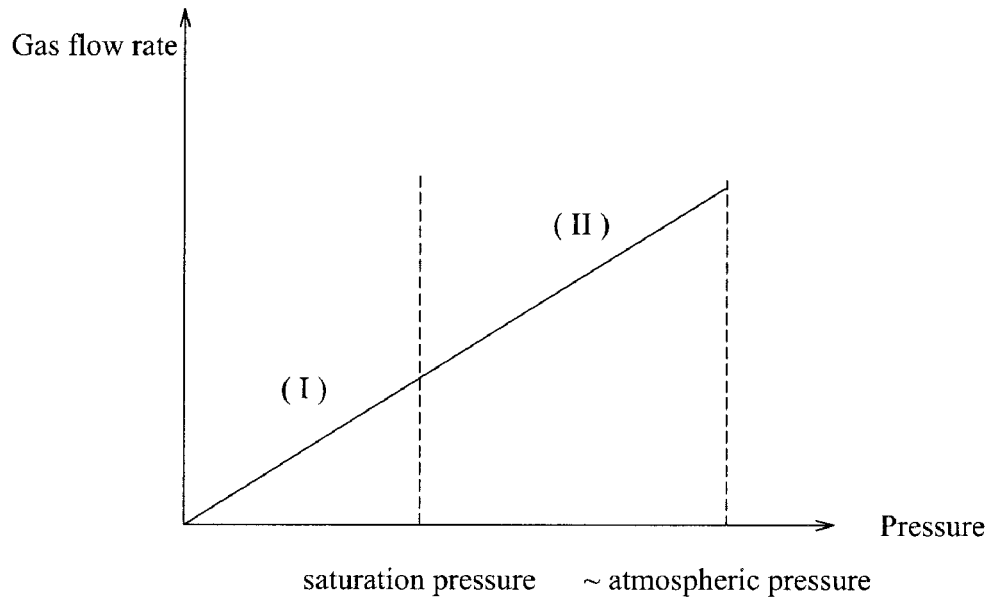
Figure 8:
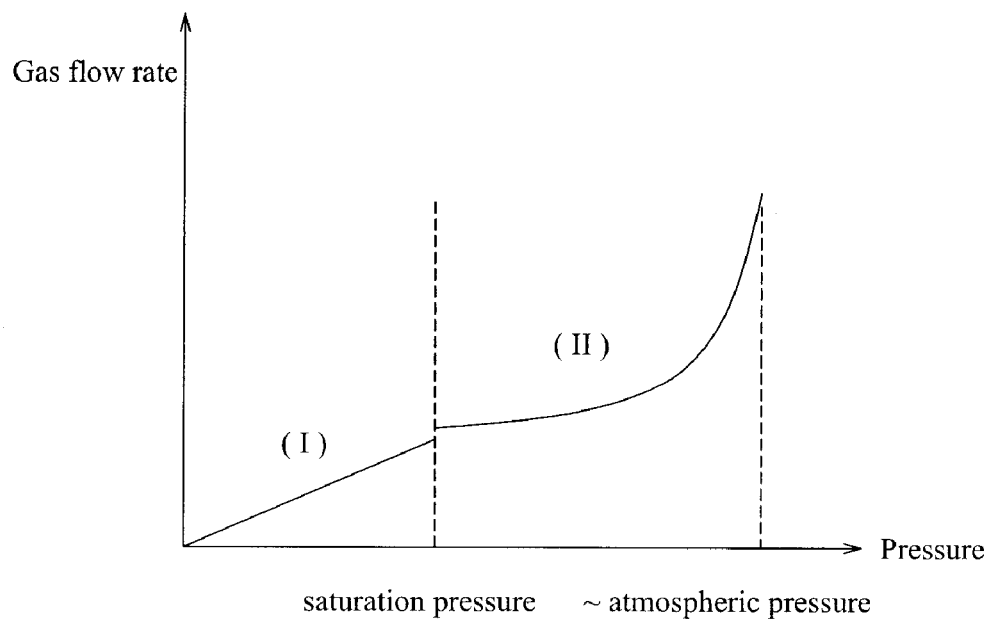
Figure 9:
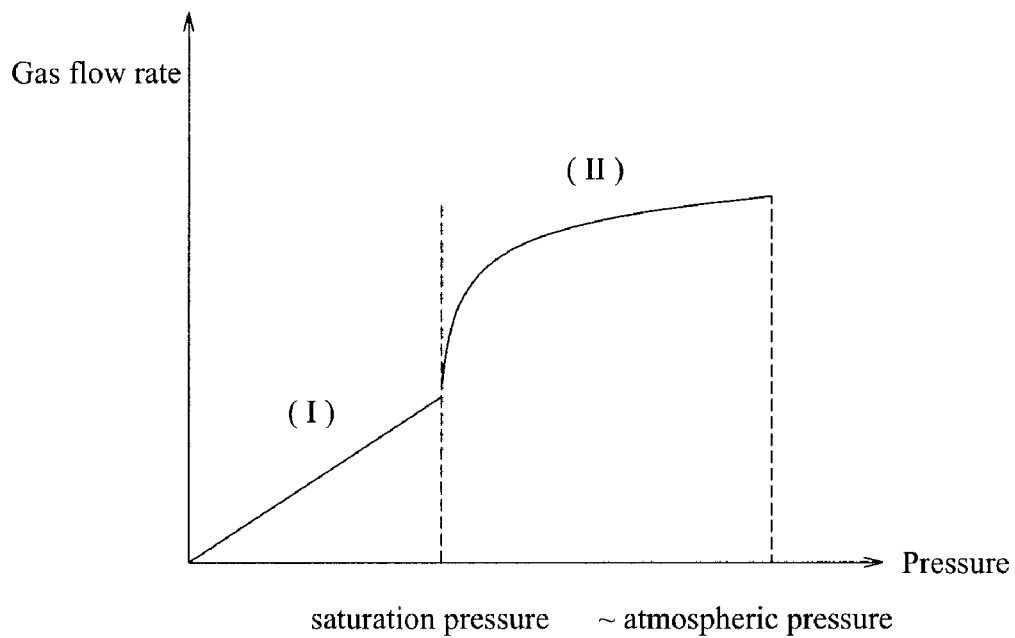

Recall that the second gas flow rate is generally selected to be equal to or higher than the first gas flow rate for the purpose of speeding up the gas venting process. In the embodiments in FIG. 4 to FIG. 6, the second gas flow rate is selected to be constant. Alternatively, it can vary, as illustrated in FIG. 7 to FIG. 9. In one embodiment, the second gas flow rate increases at another incremental rate, which is not necessarily to be differential. In the embodiment of FIG. 7, this incremental rate of the second gas flow rate is a constant, thus the locus of the second gas flow rate is a straight line, as illustrated in stage (II) of FIG. 7. In the embodiment of FIG. 8, the incremental rate of the second gas flow rate increases with time, the locus of the second gas flow rate is thus a parabolic curve with an opening facing upwards, as illustrated in stage (II) of FIG. 8. In the embodiment of FIG. 9, the incremental rate of the second gas flow rate decreases with time, the locus of the second gas flow rate is thus a parabolic curve with an opening facing downwards, as illustrated in stage (II) of FIG. 9. It is noted that in the three embodiments respectively shown in FIG. 7 to FIG. 9, the gas is designed to be vented at the individual first gas flow rate (each changes with a corresponding specified incremental rate) at least for a certain period of time before the first (saturation) pressure level is reached. As shown, in the cases of FIG. 7 to FIG. 9, the first gas flow rate is continuously used until the saturation pressure is reached.

Figure 10:
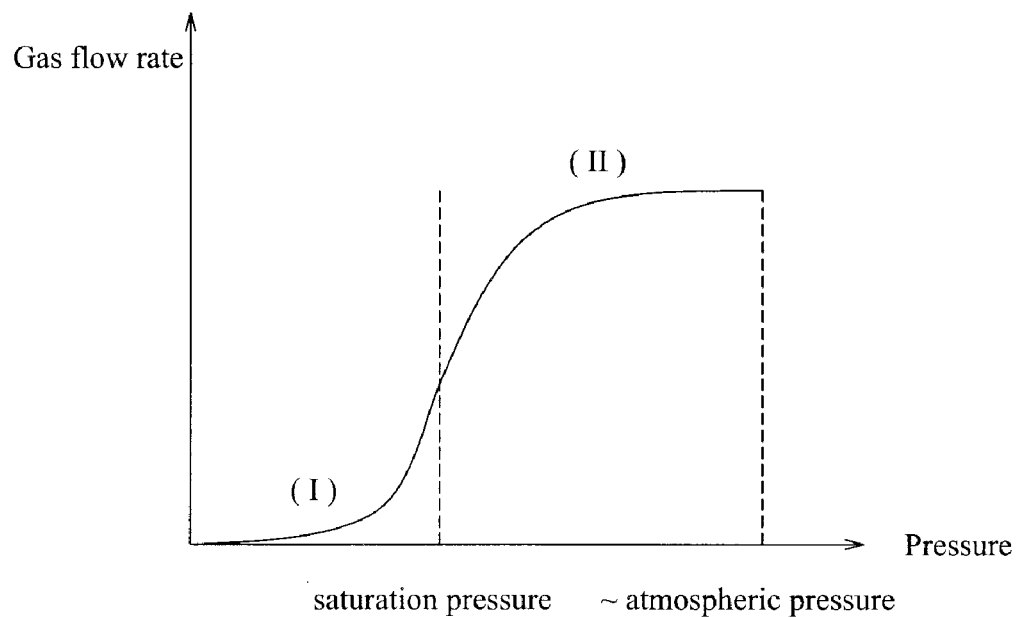

It is noted that although in FIG. 7 to FIG. 9, a constant incremental rate for the first gas flow rate is used for convenience of explanation; varying incremental rate for the first gas flow rate, as those described in conjunction with FIG. 4 to FIG. 6, may also be used in FIG. 7 to FIG. 9. An example is given in FIG. 10, where both the first and second gas flow rate have a changing incremental rate. As shown, the first gas flow rate has an increasing incremental rate as illustrated in stage (I) of FIG. 10, and the second gas flow rate has a decreasing incremental rate as illustrated in stage (II) of FIG. 10.

In practice, the flow rate of the venting gas is determined by the opening area of the valve. FIG. 11 to FIG. 16 are diagrams respectively illustrating operations of a gas venting process based on the valve opening area in accordance with embodiments of the present invention. Generally, the larger the valve opening area is, the higher the gas flow rate is. Thus, the relationship between the valve opening area and pressure inside the closed space is similar to that between the gas flow rate and the pressure inside the closed space, as those illustrated in conjunction with FIG. 4 to FIG. 10.

Figure 11:
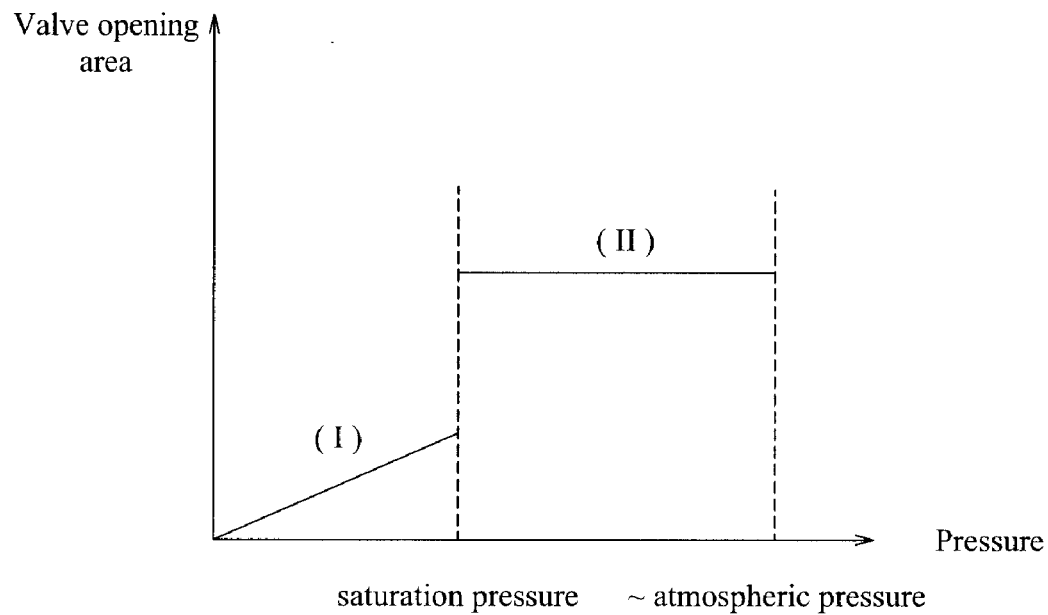
FIG. 11 to FIG. 16 are diagrams respectively illustrating operations of a gas venting process based on the valve opening area in accordance with embodiments of the present invention.

In the embodiments illustrated with FIG. 11 to FIG. 16, the valve opening area in operational stage (I) will be referred to as a first valve opening area, and the valve opening area in operational stage (II) will be referred to as a second valve opening area, for convenience of description. In the embodiment of FIG. 11, the first valve opening area is set to be zero i.e. the valve is closed at beginning and then it is increased at a differential incremental rate. In this embodiment, the incremental rate is a constant. As shown, the locus of the first valve opening area is thus a straight line. When the pressure inside the closed space reaches a predefined saturation pressure, the second valve opening area starts to be used, as illustrated in stage (II) of FIG. 11. As shown, in this embodiment the second valve opening area is set to be higher than the first valve opening area, and is maintained at a constant as illustrated in stage (II) in FIG. 11. As a result, the venting gas is supplied at a faster speed, and the overall gas venting process can be speeded up. The gas venting process ends when the pressure inside the closed space reaches the desired pressure level. It is noted that the specified incremental rate of the first valve opening area is designed to be used at least for a certain period of time before the first (saturation) pressure level is reached. As shown in FIG. 11, in this embodiment the specified incremental rate is continuously used until the saturation pressure is reached.

Figure 12:
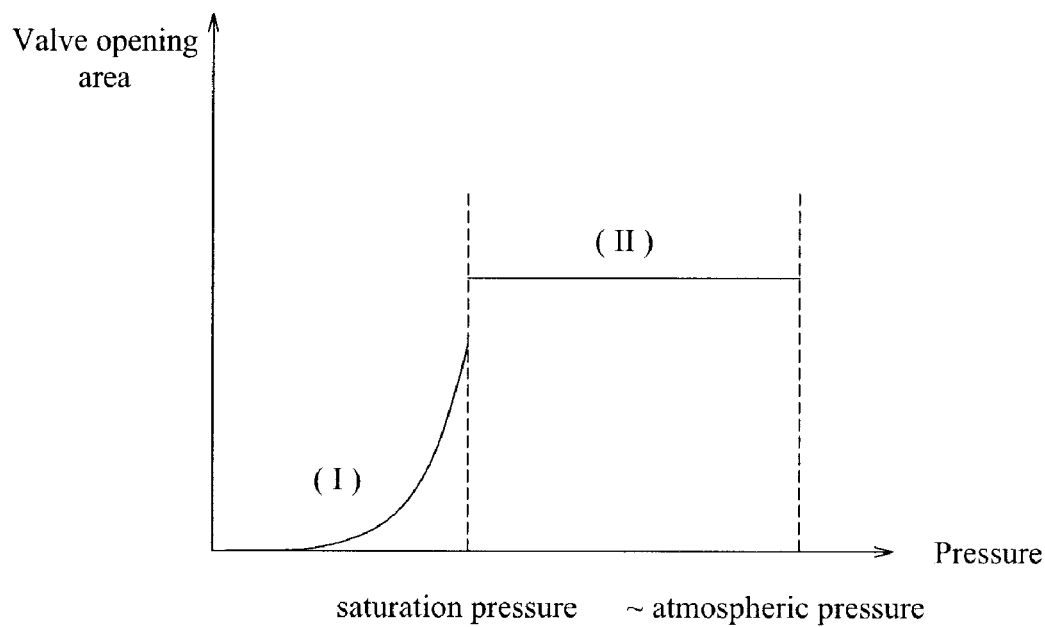
Figure 13:
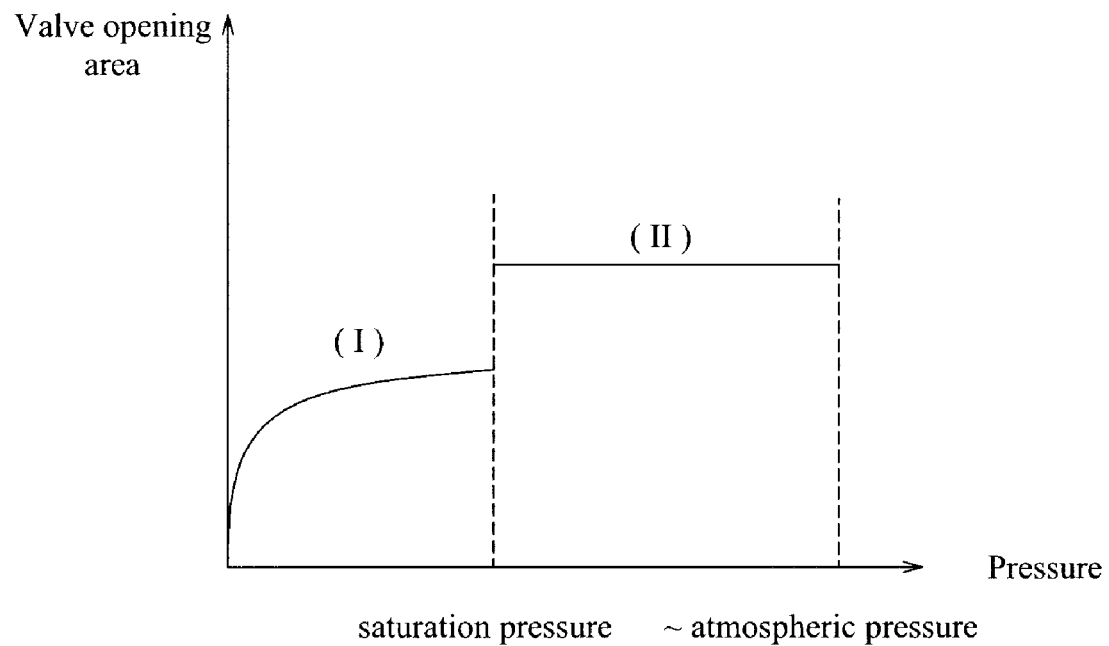

FIG. 12 and FIG. 13 illustrate alternative embodiments of FIG. 11. In the embodiment of FIG. 12, the first valve opening area is preferably set to be zero i.e. the valve is closed at beginning, and then it is increased with a differential incremental rate which increases with time at a certain rate, as illustrated in stage (I) of FIG. 12. The locus of the first valve opening area is thus a parabolic curve with an opening facing upwards, as illustrated in FIG. 12. Then, when the saturation pressure is reached, the second valve opening area starts to be used, as illustrated in stage (II) of FIG. 12. As shown, in this embodiment the second valve opening area is increased comparing to the first valve opening area, and is maintained constant. On the other hand, in the embodiment of FIG. 13, the first valve opening area is preferably set to be zero i.e. the valve is closed at beginning, and then it is increased at a differential incremental rate which decreases with time at a certain rate, as illustrated in stage (I) of FIG. 13. The locus of the first valve opening area is thus a parabolic curve with an opening facing downwards, as illustrated in FIG. 13. Then, when the saturation pressure is reached, the second valve opening area starts to be used, as illustrated in stage (II) of FIG. 13. As shown, in this embodiment the second valve opening area is increased comparing to the first valve opening area, and is maintained at a constant. In the above cases, the venting process ends when the pressure inside the closed space reaches the desired atmospheric pressure. It is noted that in both embodiments, the specified incremental rate of the first valve opening area is designed to be used at least for a certain period of time before the first (saturation) pressure level is reached. As shown in FIG. 12 and FIG. 13, in both embodiments the specified incremental rate is continuously used until the saturation pressure is reached.

Figure 14:
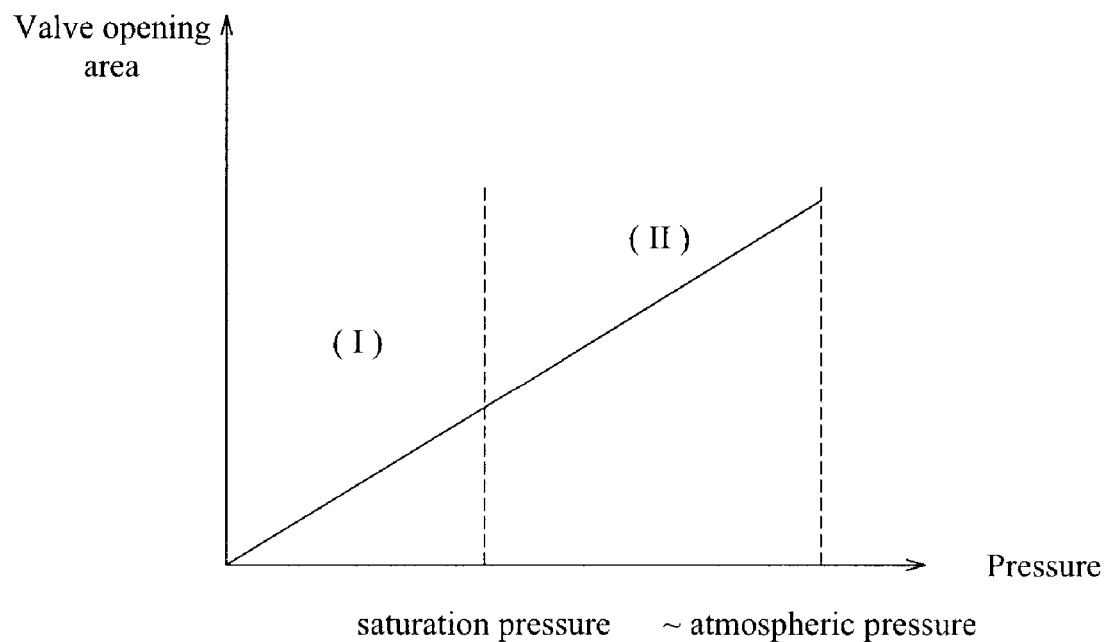
Figure 15:
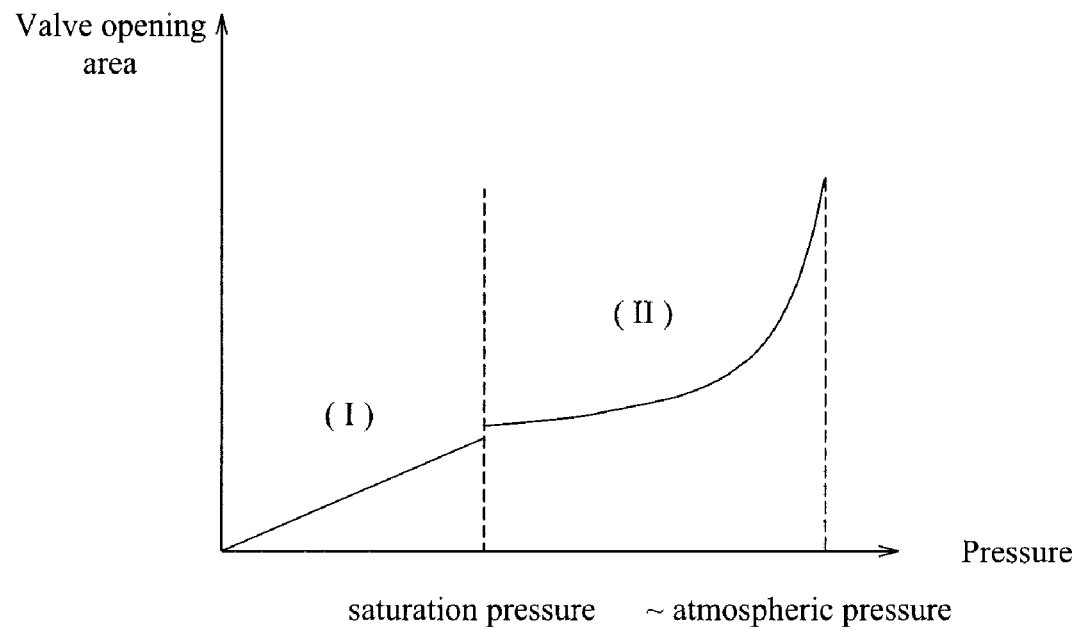
Figure 16:
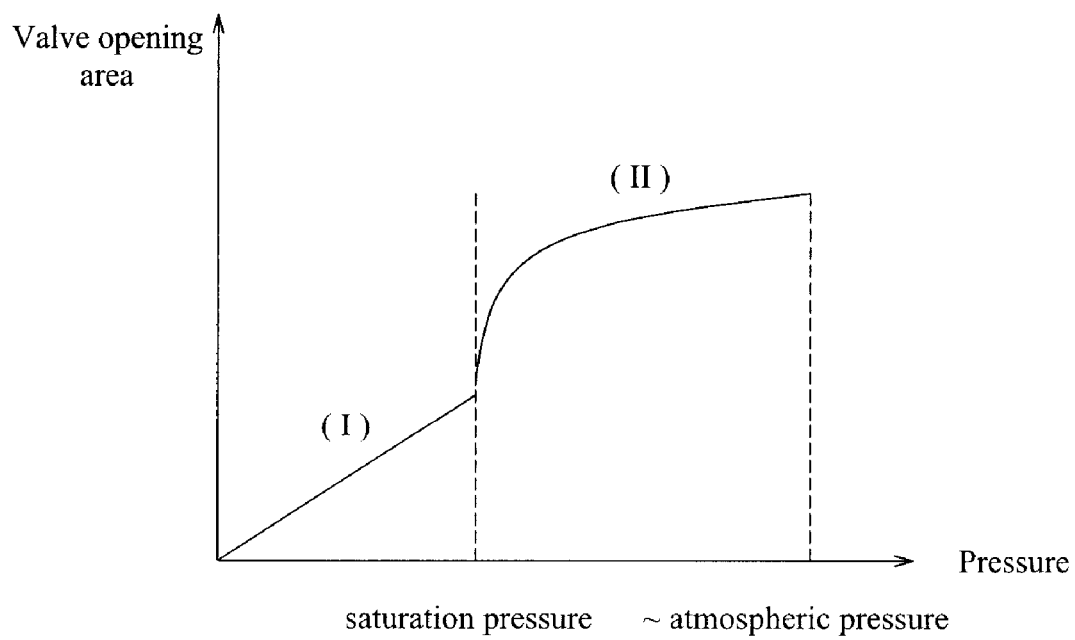

It is noted that after the time point when the saturation pressure level is reached, the second valve opening area may be set to be a constant, as illustrated in FIG. 11 to FIG. 13. Alternatively, the second valve opening area can vary with another incremental rate as illustrated in FIG. 14 to FIG. 16. This incremental rate of the second valve opening area may not necessarily be differential. In one example, it is a constant, thus the locus of the second valve opening area is a straight line, as illustrated in stage (II) of FIG. 14. In another example, it increases with time, and the locus of the second valve opening area is thus a parabolic curve with an opening facing upwards, as illustrated in stage (II) in FIG. 15. In further example, it decreases with time, and the locus of the second valve opening area is thus a parabolic curve with an opening facing downwards, as illustrated in stage (II) of FIG. 16.

In summary, in the present invention, the gas flow rate, which is mainly determined by the valve opening area, increases at a substantially differential incremental rate for at least a certain period of time before the pressure inside the closed space reaches saturation pressure, so that the gas venting process does not cause particle contamination on the surface of the sample. Moreover, the starting point of the venting gas flow rate is set to be zero, thus the same operational result i.e. the resultant convention characteristics inside the closed space at least at the beginning of the gas venting process is more ensured to be the same as compared to the conventional art where an accurate sudden rise in the gas flow rate from zero is required to deliver reproducible resultant convention characteristics inside the closed space, at least at the beginning of the gas venting process.

Figure 17:
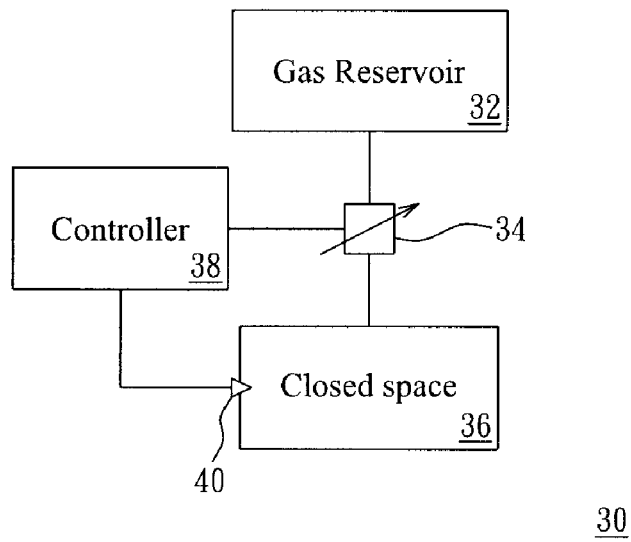
FIG. 17 to FIG. 20 are block diagrams respectively illustrating various gas supply assemblies for venting a gas into a closed space in accordance with different embodiments of the present invention.

FIG. 17 is a block diagram illustrating a gas supply assembly for venting a gas into a closed space in accordance with an embodiment of the present invention. The gas supply assembly 30 includes a gas reservoir 32 for providing a gas at a predefined pressure; a proportional control valve 34 for controlling the gas flow rate of the gas being vented into a closed space 36; and a controller 38 coupled to the proportional control valve 34 and the closed space 36. In one embodiment, the controller 38 connects with a pressure gauge 40 which is set within the closed space 36, so that the controller 38 can collect instant information of pressure inside the closed space 36 through the pressure gauge 40 and operates the proportional valve 34 in real time based on the collected pressure information.

The proportional control valve 34 can be an electro-magnetic valve which is able to open differentially. A proportional control valve may be controlled by electronic amplifier boards to adjust the direction and amount of fluid flow. In practice, the control valve may comprise, for example, a D.C. coil and a valve assembly sitting on an orifice. Flow is regulated by varying the valve drive voltage to the D.C. coil, which creates a magnetic field lifting the valve assembly from the orifice to allow fluid flow control. Proportional control valves are commonly seen in many different applications; varying details of their mechanical design and working principals should not be used to limit the scope of the present invention, which is to be defined by the claims incorporated in this specification.

Figure 18:
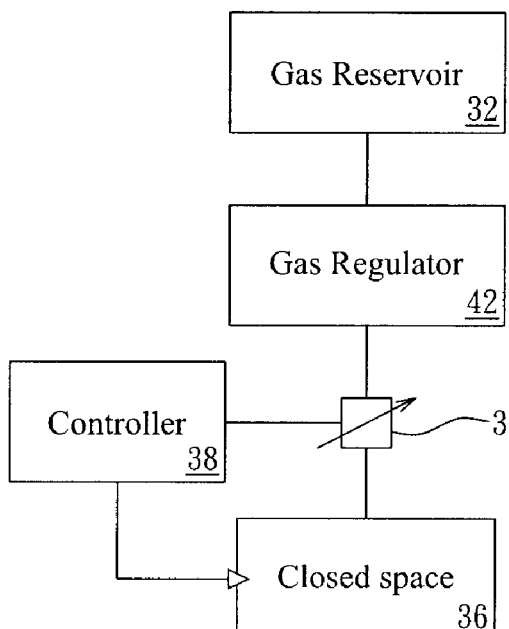

As illustrated in FIG. 18, in one embodiment, the gas supply assembly 30 further includes a gas regulator 42 configured between the gas reservoir 32 and the proportional control valve 34. The gas regulator 42 is used for reducing the pressure gap between the gas reservoir 32 and the proportional control valve 34 so as to prevent damages from being caused to the proportional control valve 34. The pressure inside the gas reservoir 32 is typically 80~110 psi. In one example, the regulator 42 lowers the pressure of gas from the gas reservoir 32 and maintains it at a pressure level of 10~30 psi.

Figure 19:
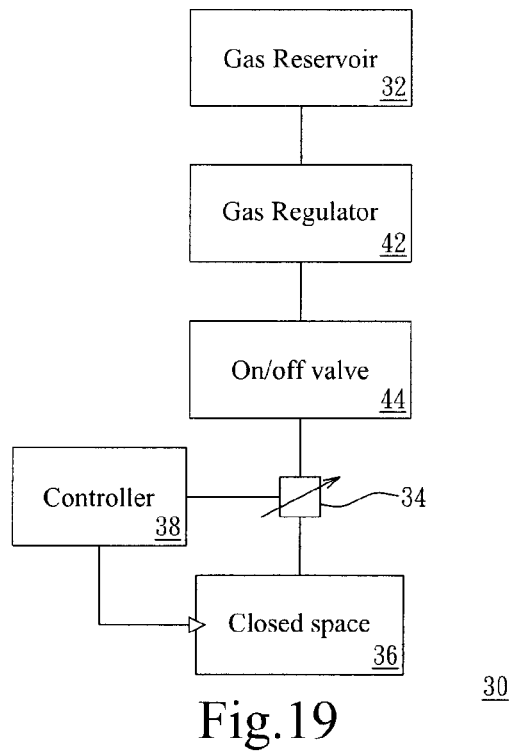

As illustrated in FIG. 19, in one embodiment, the gas supply assembly 30 further includes an on/off valve 44 configured between the gas regulator 42 and the proportional control valve 34. The on/off valve 44 is used for providing additional air-tightness effect to the system, especially when the proportional control valve 34 is closed. Use of the on/off valve 44 can further reduce the possibility of leakage from the system. In the configuration illustrated in FIG. 19, when the airway running from the gas reservoir 32 to the closed space 36 is "open", the strength of the gas stream flowing in the airway may be controlled by the proportional control valve 34. When the airway is "closed", the air-tightness of it may be controlled by only the proportional control valve 34, only the on/off valve 44, or both the proportional control valve 34 and on/off valve 44.

Figure 20:
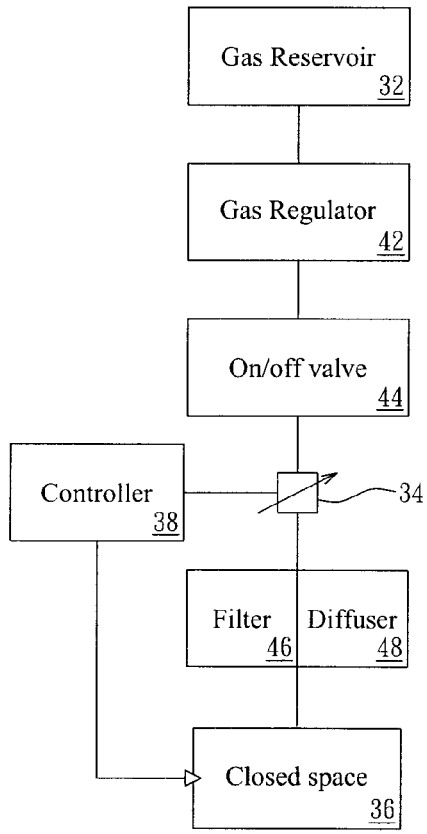

As illustrated in FIG. 20, in one embodiment, the gas supply assembly 30 further includes a filter 46 and a diffuser 48 configured between the proportional control valve 34 and the closed space 36. The filter 46 is used to screen off particles carried in the gas stream thereby further improving the effectiveness of particle contamination control. For example, the filter 46 can be an artificial membrane which is made from metal or ceramic, homogenous films (polymers), heterogeneous solids (polymeric mixes, mixed glasses), or liquids. The diffuser 48 is used to further lower the flow rate of the gas stream before it enters the closed space 36, by distributing the gas molecules and putting them in diffusion-driven motion. These two components can be independently arranged or integrated in one unit.

Figure 21:
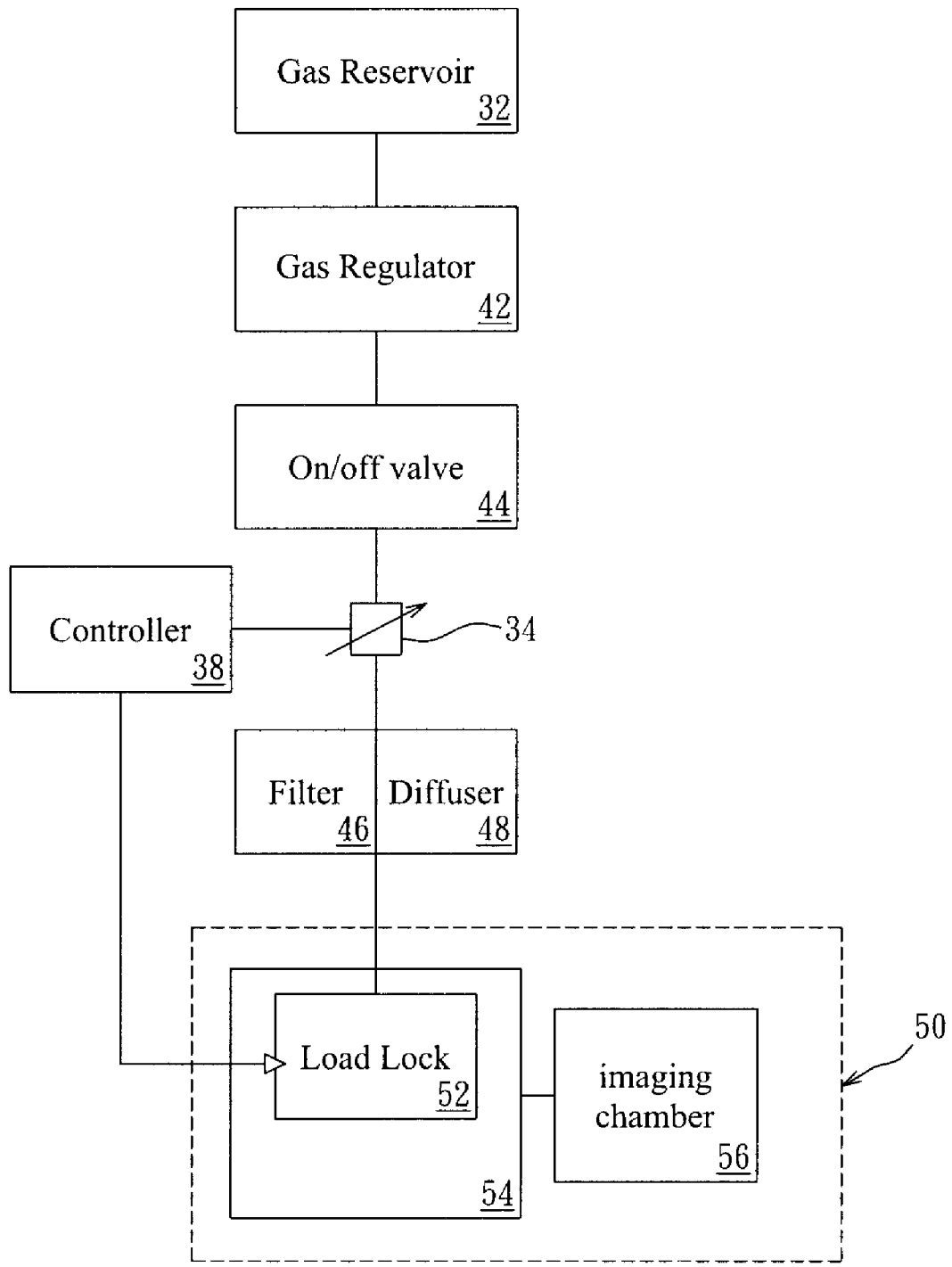
FIG. 21 is a block diagram illustrating a charged particle beam inspection system with a gas supply assembly in accordance with an embodiment of the present invention.

In practice, the disclosed gas supply assembly may be integrated in a charged particle beam imaging system, such as a scanning electron microscope (SEM) system. FIG. 21 is a block diagram illustrating a charged particle beam imaging system with a gas supply assembly in accordance with an embodiment of the present invention. In a charged particle beam imaging system 50, a closed space is formed by a load lock structure 52 within a conditioning chamber 54 which is coupled with an imaging chamber 56. The conditioning chamber 54 and imaging chamber 56 may be similar to those described in the background, thus details thereof will not be repeated herein. When imaging of an interested sample is complete, the sample is transferred out from the imaging chamber 56 and into the conditioning chamber 54. The sample is typically placed in the closed space formed by the load lock structure 52. The environmental pressure of the imaged sample must be raised to close to the atmospheric pressure before the sample can be transferred to the next stage of operation. To achieve this, gas is vented into the closed space. It is noted that at the beginning of the gas venting process the interior of the closed space should be substantially in vacuum. This provides the imaged sample with an environment similar to that in the imaging chamber 56 where the sample was imaged.

In one embodiment, the aforementioned gas supply assembly 30 couples with the load lock structure 52 for venting an inert gas into a closed space formed within the load lock structure 52. As described earlier, with the disclosed gas supply assembly 30, the venting gas can be first vented into the closed space at a first gas flow rate, which increases at a substantially differential incremental rate, until the pressure inside the closed space changes from the vacuum pressure to a first pressure level, then the gas is vented into the closed space at a second flow rate until the pressure inside said closed space reaches a second pressure level. The first gas flow rate is preferably to start from zero. The first pressure level may be substantially equal to or greater than a saturation pressure inside the closed space at which the incoming gas no longer induces disturbance and/or convection in the closed space. The second pressure level may be set to be close to that of the atmosphere. Details of the gas supply assembly 30 and the gas venting process are similar to that in the embodiments described in conjunction with FIG. 4 to FIG. 20 and will not be repeated here. It is noted that, the gas supply assembly 30 shown in FIG. 21 is only of an example. Simplified configurations of gas supply assembly 30 as those described in conjunction with FIG. 17 to FIG. 20 can be used as well.

To sum up, in the present invention, a method for venting a gas into a closed space is disclosed, wherein during the gas venting process, the gas flow rate or the valve opening area starts from zero and then increase at a substantially differential incremental rate for a certain time period, so that particle contamination on the sample surface may be well controlled, and operational setting parameters may be reused with higher confidence.

Although the present invention has been explained in relation to its preferred embodiment, it is to be understood that other modifications and variation can be made without departing the spirit and scope of the invention as hereafter claimed.

What is claimed is:

1. A method for venting a gas into a closed space, comprising:
   venting said gas, with a first gas flow rate, into said closed space until the pressure inside said closed space reaches a first pressure level, wherein said first gas flow rate increases at a substantially differential incremental rate for at least a predefined period of time before said first pressure level is reached; and
   venting said gas, with a second gas flow rate, into said closed space until the pressure inside said closed space reaches a second pressure level.

2. The method of claim 1, wherein said second gas flow rate is equal to or higher than said first gas flow rate at the time point when said first pressure level is reached.

3. The method of claim 1, wherein said first gas flow rate starts from zero.

4. The method of claim 1, wherein said incremental rate is constant.

5. The method of claim 1, wherein said incremental rate increases with time.

6. The method of claim 1, wherein said incremental rate decrease with time.

7. The method of claim 1, wherein said second gas flow rate is constant.

8. The method of claim 1, wherein said second gas flow rate varies.

9. The method of claim 8, wherein said second gas flow rate increases at a predefined another incremental rate,
   and wherein said another incremental rate is constant.

10. The method of claim 8, wherein said second gas flow rate increases at a predefined another incremental rate,
    wherein said another incremental rate increases with time.

11. The method of claim 8, wherein said second gas flow rate increases at a predefined another incremental rate,
    wherein said another incremental rate decreases with time.

12. The method of claim 1, wherein said incremental rate is equal to or less than 0.1 Torr/second.

13. The method of claim 1, wherein said first pressure level is equal to or higher than one-thousandth of the atmospheric pressure.

14. The method of claim 1, wherein said second pressure level is equal to or higher than 1.0 times of the atmospheric pressure.

15. The method of claim 1, wherein the pressure inside said closed space at the beginning of the venting process is equal to or lower than $1.0 \times 10^{-5}$ Torr.

16. The method of claim 1, wherein said closed space is formed in a load lock of a charged particle beam imaging system and the venting process begins after an imaged sample is transferred into said load lock.

17. A charged particle beam imaging system, comprising:
    an image forming apparatus for scanning a charged particle beam probe across a sample to be imaged thereby forming a voltage contrast image of said sample;
    an imaging chamber where said sample is secured during imaging, the interior of said imaging chamber is set to be at a vacuum pressure;
    a conditioning chamber connected with said imaging chamber to receive imaged said sample therefrom, for changing the environmental pressure of imaged said sample from said vacuum pressure to the atmospheric pressure before further transferring imaged said sample; and
    a gas supply assembly for venting a gas into said conditioning chamber, such that said gas is vented into said conditioning chamber at a first gas flow rate until the pressure inside said conditioning chamber changes from said vacuum pressure to a first pressure level, then said gas is vented into said conditioning chamber at a second flow rate until the pressure inside said conditioning chamber reaches a second pressure level, wherein said first gas flow rate increases at a substantially differential incremental rate for at least a predefined period of time before said first pressure level is reached.

18. The charged particle beam imaging system of claim 17, wherein said gas supply assembly comprises:
    a gas reservoir for providing said gas at a predefined pressure;
    a proportional control valve for controlling the flow rate of said gas being vented into said conditioning chamber; and
    a controller coupled to said valve and said conditioning chamber, wherein said controller operates said valve based on pressure information measured from inside said conditioning chamber.

19. The charged particle beam imaging system of claim 17, wherein said first gas flow rate starts from zero, and wherein said incremental rate is equal to or less than 0.1 Torr/second.

20. The charged particle beam imaging system of claim 17, wherein said first pressure level is equal to or higher than one-thousandth of the atmospheric pressure, and said second pressure level is equal to or higher than 1.0 times of the atmospheric pressure.

* * * * *